United States Patent [19]
Bour et al.

[11] Patent Number: 5,379,312
[45] Date of Patent: Jan. 3, 1995

[54] SEMICONDUCTOR LASER WITH TENSILE-STRAINED ETCH-STOP LAYER

[75] Inventors: David P. Bour, Cupertino; David W. Treat, San Jose, both of Calif.

[73] Assignee: Xerox Corporation, Stamford, Conn.

[21] Appl. No.: 142,742

[22] Filed: Oct. 25, 1993

[51] Int. Cl.⁶ .............................................. H01S 3/19
[52] U.S. Cl. ........................................ 372/45; 372/46; 437/129
[58] Field of Search ...................... 372/45, 46; 437/129

[56] References Cited

U.S. PATENT DOCUMENTS

| | | | |
|---|---|---|---|
| 5,175,740 | 12/1992 | Elman et al. | 372/45 |
| 5,177,757 | 1/1993 | Tsugami | 372/45 |
| 5,189,680 | 2/1993 | Kimura | 372/46 |
| 5,282,218 | 1/1994 | Okajima et al. | 372/46 |
| 5,305,341 | 4/1994 | Nishikawa et al. | 372/45 |

OTHER PUBLICATIONS

T. Tanaka, S. Minagawa and T. Kajimura, *Transverse-mode-stabilized ridge stripe AlGaInP semiconductor lasers incorporating a thin GaAs etch-stop layer*, Appl. Phys. Letts. 54, 1391 Apr. 1989.

K. Kobayashi, Y. Ueno, H. Hotta, A Gomyo, K. Tada, K. Hara and T. Yuasa, *632.7 nm CW operation (20°C.) of AlGaInP visible laser diodes fabricated on (001) 6° off toward [110] GaAs substrate*, Jpn. Jour. Appl. Phys. 29, L1669 Sep. 1990.

Y. Ueno, H. Fujii, H. Sawano and K. Endo, *Stable 30 Mw operation at 50°C. for strained MQW AlGaInPP visible laser diodes*, Electronics Letts. 28, 860 Mar. 1992.

"Transverse-mode-stabilized ridge stripe ALGaInP semiconductor lasers incorporating a thin GaAs etch-stop layer," T. Tanaka, S. Minagawa and T. Kajimura, Appl. Phys. Lett. 54, 1391-1393, 10 Apr. 1989.

"632.7 nm CW Operation (20°C.) of ALGaInP Visible Laser Diodes Fabricated on (001) 6° off toward [110] GaAs Substrate," K. Kobayashi, Y. Ueno, H. Hotta, A. Gomyo, K. Tada, K. Hara and T. Yuasa, Jpn, Jour, Appl. Phys. 29, L1669 Sep. 1990.

"Stable 30 mW Operation at 50°C. for Strained MQW ALGaInP Visible Laser Diodes," Y. Ueno, H. Fujii, H. Sawano and K. Endo, Electronics Letts. 28, 860 Mar. 1992.

*Primary Examiner*—Georgia Y. Eps
*Attorney, Agent, or Firm*—Rosen, Dainow & Jacobs

[57] ABSTRACT

Ridged waveguide and selectively-buried ridged waveguide, index-guided, visible semiconductor lasers incorporating a lattice-mismatched, preferably tensile-strained, etch-stop layer in the design and fabrication of the laser. Compared with other structures with etch-stop layers that are lattice matched, the etch-stop layer of the invention would have greater etch-rate selectivity, and the resulting structure would be more optically transparent with less transverse mode distortion and would present fewer difficulties with layer regrowth. These advantages would translate into greater design flexibility, more reliable fabrication, and better device performance. A preferred material for the etch-stop layer is $Ga_xIn_{1-x}P$ ($x>0.5$).

14 Claims, 1 Drawing Sheet

SEMICONDUCTOR LASER WITH TENSILE-STRAINED ETCH-STOP LAYER

This invention relates to ridge waveguide semiconductor lasers, and in particular to a method of fabricating such lasers.

BACKGROUND OF INVENTION

The ridge waveguide and the selectively-buried ridge (SBR) waveguide are the dominant structures used for making index-guided $(Al_xGa_{1-x})_{0.5}In_{0.5}P$ visible semiconductor lasers. The ridge-etching is a critical fabrication step for these devices, as the etch should terminate within a few hundred nanometers of the active region of the laser. To simplify this critical procedure, an etch stop layer, constructed of a material which etches very slowly compared to the surrounding AlGaInP cladding layer material, is often incorporated into the layer structure. A further advantage of an etch stop layer is that the etch depth uniformity is determined by the very low nonuniformity associated with epitaxial growth, rather than the greater nonuniformity associated with the etching process.

Etch stop layers have already been reported and used to make index-guided AlGaInP lasers. See for example:

T. Tanaka, S. Minagawa and T. Kajimura, *Transverse-mode-stabilized ridge stripe AlGaInP semiconductor lasers incorporating a thin GaAs etch-stop layer*, Appl. Phys. Letts. 54, 1391 (1989), K. Kobayashi, Y. Ueno, H. Hotta, A. Gomyo, K. Tada, K. Hara and T. Yuasa, *632.7 nm CW operation (20° C.) of ALGaInP visible laser diodes fabricated on (001) 6° off toward [110] GaAs substrate*, Jpn. Jour. Appl. Phys. 29, L1669 (1990), and Y. Ueno, H. Fujii, H. Sawano and K. Endo, *Stable 30 Mw operation at 50° C. for strained MQW AlGaInP visible laser diodes*, Electronics Letts. 28, 860 (1992).

Demonstrated etch-stop (ES) layer materials include AlGaAs, GaAs, and $(AlGa)_{0.5}In_{0.5}P$, all of which are lattice matched to the GaAs substrate. Of primary concern are the composition selectivity of the etch, along with optical transparency, so that optical absorption loss is not introduced into the laser stripe. Thus, although GaAs is essentially unetched by the usual etchants for AlGaInP, a GaAs ES layer must be made very thin (on the order of 1 nm) in order to quantum-shift its absorption edge to a wavelength around 650 nm or shorter. Likewise, a lattice-matched $Ga_{0.5}In_{0.5}P$ ES layer must also be made very thin, for optical transparency. This compromises its effectiveness as an ES layer, however, since its etch selectivity is not so great. Although higher-bandgap AlGaAs and $(AlGa)_{0.5}In_{0.5}P$ can also be used as an ES layer, it is difficult to find etchants with the requisite high selectivity, and the aluminum-containing ES layer can make epitaxial regrowth difficult. Furthermore, in case of (Al,Ga)As, one prefers to avoid arsenide-phosphide interfaces in growth.

SUMMARY OF THE INVENTION

An object of the invention is an improved ridge or SBR waveguide structure for an index-guided semiconductor laser.

Another object of the invention is an improved method for fabricating a ridge or SBR waveguide structure for an index-guided semiconductor laser.

According to one aspect of the invention, a lattice-mismatched ES layer is incorporated in the device for the purpose of terminating an etching step used to define the shape of the ridge waveguide used to optically confine the laser radiation to the active region.

In a preferred embodiment of the invention, a tensile-strained ES layer is used.

For use in the fabrication of the AlGaInP ridge or SBR waveguide lasers, a preferred ES layer is $Ga_xIn_{1-x}P$ ($x > 0.5$), which would be tensile-strained when grown on a GaAs substrate and when $x > 0.5$. Compared with other structures with etch-stop layers that are lattice matched, the fabrication method of the invention would have greater etch-rate selectivity, and the resulting structure would be more optically transparent with less transverse mode distortion and would present fewer difficulties with layer regrowth. These advantages translate into greater design flexibility, more reliable fabrication, and better device performance.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTs

Figure 1:
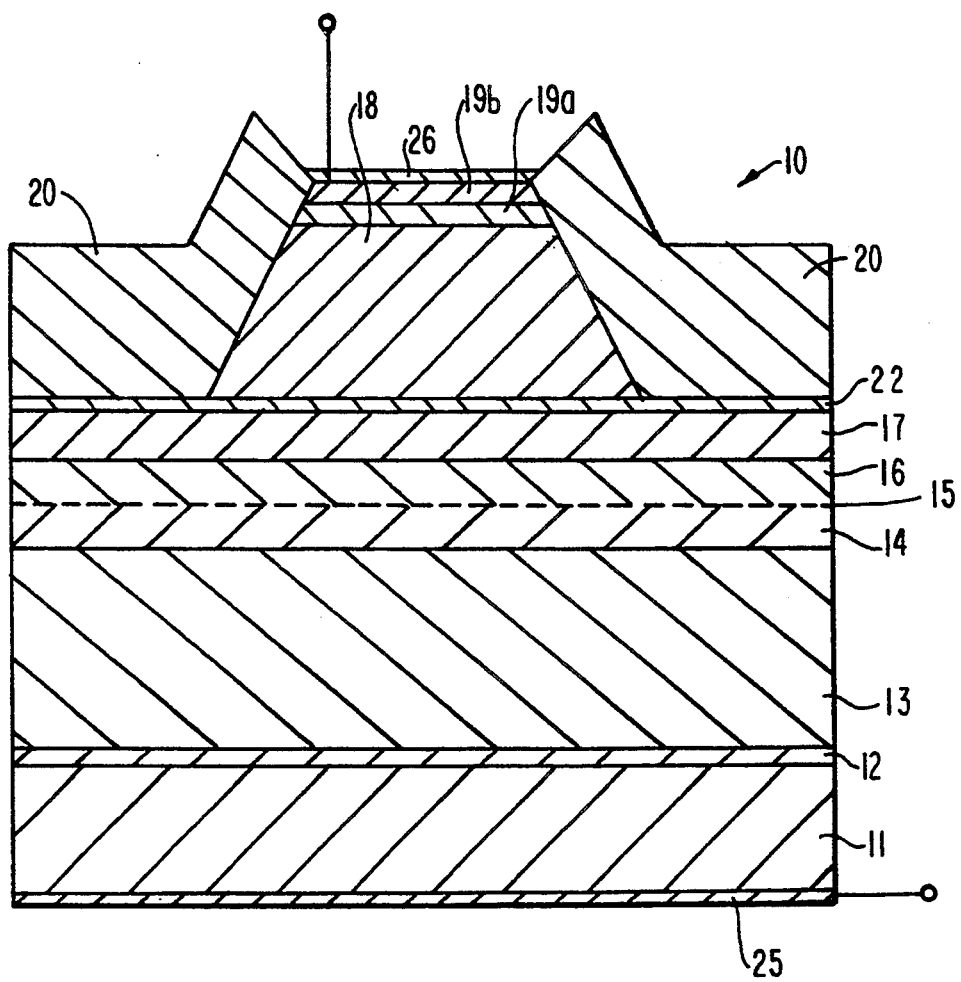
FIG. 1 is a cross-sectional view of one form of ridge waveguide laser incorporating the ES layer of the invention.

FIG. 1 shows a typical design of a ridge waveguide laser 10 in the III-V alloy system. In this particular case, the laser 10 produces visible radiation and incorporates as the active layer a quaternary alloy, AlGaInP, built up on a GaAs substrate. The GaAs substrate is designated 11, on which is epitaxially deposited in a known manner a succession of layers comprising, in order: a lower AlGaInP cladding layer 13, AlGaInP separate confinement heterojunction (SCH) layers 14, 16 flanking an active layer 15 of AlGaInP, an inner AlGaInP cladding layer 17, a mesa or ridge-shaped AlGaInP cladding layer 18, an upper cap layer of GaInP 19a/GaAs 19b, with the mesa 18 and cap layer 19a, 19b flanked longitudinally by regrown GaAs 20. Typically, the conductivity types below the active layer 15 are N-type conductivity, and the conductivity types above the active layer 15 are P-type, except for the regrown portions 20 which are N-type to provide a P-N barrier and thus confine electron flow to the mesa region 18 to increase laser efficiency.

Everything described so far in the detailed description in connection with the FIG. 1 device is conventional, and reference is made to the published papers identified above which are incorporated herein by reference, for more details on the compositions, thicknesses and manner of fabricating such known structures.

In fabricating such a device, layers 18 and 19 as deposited originally extend over the same area as the layers underneath, after which a known etch-resistant mask, such as, for example, $SiO_2$ or $Si_3N_4$, is applied on top to define the width of the mesa, and the structure subjected to conventional etching as described above and in the referenced papers to remove the lateral P-type layer portions down to the layer 17 to form the stripe or mesa 18, 19, following which N-type semiconductor material 20 is regrown on the exposed sides of the mesa 18, 19. To prevent etching of the layer 17, an etch stop (ES) layer 22 is incorporated in the structure between the layers 18 and 17. The ES layer 22 not only prevents etching of the layer 17 underneath by exhibiting a very slow etch rate compared with that of layers 18 and 19, but also must fulfill several other functions, which include providing a good surface for the epitaxially-deposited, regrown regions 20, as well as to maximize optical transparency to the emitted wavelengths to minimize optical absorption.

We have found that using a tensile-strained layer as the ES layer offers a number of advantages over the known matched ES layers. Especially good results are obtained with a tensile-strained $Ga_xIn_{1-x}P$ (x>0.5) ES layer. We have found that a tensile-strained $Ga_xIn_{1-x}P$ (x>0.5) ES layer can be a more-forgiving and more-effective alternative to the lattice-matched etch stop layers. It is placed like other, lattice-matched, ES layers, within a few hundred nm of the active region, as shown in FIG. 1. It's advantages include:

1. Compared to a lattice matched GaAs or $Ga_{0.5}In_{0.5}P$ ES layer, the tensile-strained ES layer is automatically transparent, and needn't rely on quantum shifts to increase the energy of the absorption edge Even for wavelengths as short as 550 nm, the composition can be easily adjusted for transparency, while maintaining an adequate ES thickness of 40–100 A. For example, at shorter wavelengths, the GaP alloy content (x) is made greater, to shift the absorption edge to a shorter wavelength. In contrast, a lattice-matched $Ga_{0.5}In_{0.5}P$ ES layer must become increasingly thin at shorter wavelengths. While it is desirable to keep the etch stop as thin as possible, so as not to interfere with hole injection, and not to deflect the fundamental transverse optical mode, an ES layer must have some minimum thickness to properly perform its function. Since the etch selectivity between GaInP and AlGaInP is not 100%, requiring that the etch stop be made thin can limit its effectiveness. The maximum thickness of the tensile-strained ES layer is governed by performance considerations, along with the critical thickness for pseudomorphic epitaxy. Even for x=0.7, in the formula for the ES layer however, where the absorption edge is about 560 nm, the critical thickness is greater than 100 A. Thus, it is very simple to design a highly transparent ES of adequate thickness. The preferred range is 40–100 A.

In the formula $Ga_xIn_{1-x}P$, it has been stated that x should exceed 0.5 to provide the desired tensile strain. In principle, x can equal 1, but in the latter case, the degree of strain is very high, and thus the ES layer must be made very thin to prevent undesirable effects. As explained above, a very thin ES layer places undesirable constraints on the etching process. Hence, it is preferred that x be chosen below 1 so that the ES layer can be given a minimum thickness of 40 A.

2. The usual etchants for the ridge-etch in AlGaInP index-guided lasers are hot sulfuric acid ($H_2SO_4$) or dilute hydrochloric acid ($HCl:H_2O$). For dilute HCl etching, the etch rate of $Ga_xIn_{1-x}P$ is reduced as the GaP alloy content (x) increases (it is the component which is aggressively etched by HCl, while GaP is not etched by (HCl). Thus, when using HCl, the composition selectivity to the etchant is improved compared to lattice-matched $Ga_{0.5}In_{0.5}P$. This makes the structure more tolerant of etching too long, especially when compared to an AlGaAs or AlGaInP ES.

3. The refractive index of $Ga_xIn_{1-x}P$ (x>0.5) is less than the refractive index of $Ga_{0.5}In_{0.5}P$. Therefore, the ES layer of the invention does not distort the transverse optical mode as much as a $Ga_{0.5}In_{0.5}P$ layer of the same thickness.

4. Since the $Ga_xIn_{1-x}P$ layer contains no aluminum, it does not present any problems with the GaAs regrowth which is commonly used to make the SBR structure. Indeed, we have regrown GaAs on such an ES layer (in a laser structure), and the epitaxial interface appears to be free of defects when analyzed by TEM.

An example of a laser diode, which is not to be considered limiting, in accordance with the invention is given below:

| LAYER NO. | FUNCTION | COMPOSITION | THICKNESS |
| --- | --- | --- | --- |
| 11 | substrate | GaAs | |
| 12 | buffer layer | GaAs | 0–1.0 μm |
| 13 | lower cladding | AlGaInP | 0.5–1.5 μm |
| 14 | SCH | AlGaInP | 0–2000 Å |
| 15 | active | AlGaInP | 20–1000 Å |
| 16 | SCH | same as 14 | 0–2000 Å |
| 17 | inner cladding | same as 13 | 100–5000 Å |
| 22 | ES | $Ga_{0.7}In_{0.3}P$ | 10–200 Å |
| 18 | mesa cladding | AlGaInP | 0.3–1.5 μm |
| 19a | Barrier reducer | GaInP | 500–5000 Å |
| 19b | cap | GaAs | 500–5000 Å |
| 20 | regrown | GaAs | 1 μm |

To complete the device, conventional electrode layers 25, 26 are deposited at top and bottom. Conventional methods of growing such layers, as by MOVPE, are well known in the art and need not be described further. It will be evident that the invention is not limited to the specific compositions and thickness given in the example above or as detailed in the referenced publications. In summary, we have described the use of a tensile-strained $Ga_xIn_{1-x}P$ (x>0.5) etch stop layer for AlGaInP visible index-guided lasers. With regards to etch selectivity and optical transparency, the strained etch stop layer can be an improvement over other lattice-matched etch-stop layers.

Similarly, while the invention has been described in connection with tensile-strained $Ga_xIn_{1-x}P$ (x>0.5) on GaAs as the ES layer, there are other III-V alloy systems used to make laser diodes in which similar benefits can be obtained by using a tensile-strained layer as an etch stop to improve optical transparency, or composition selectivity to an etchant, or its refractive index, or to provide a better base for a regrown region. Another example of such a system is an InP substrate with InP cladding layers, and with a tensile-strained ES layer of InGaAsP. For this system, $In_{1-x}Ga_xAs_yP_{1-y}$, lattice matching occurs when x=0.47 y. Hence, to lattice-mismatch, to produce a tensile-strained layer, either the content of GA and/or the content of P should be increased. Another system, using a GaAs substrate with (Al)GaAs cladding layers, can use as the tensile-strained ES layer AlGaAsP, with the presence of the P contributing the lattice-mismatch and the desired tensile-straining.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. This scope of the invention is indicated by the appended claims rather than by the foregoing description.

What is claimed is:

1. In a semiconductor laser generating radiation at given wavelengths and having a body comprising a substrate and epitaxially deposited over the substrate an active layer with one or more quantum wells, an optical confinement layer over the active layer, and a cladding layer, and forming a P-N junction between the cladding layer and the substrate and with an etch-stop layer located in or adjacent the cladding layer, the improvement comprising:

(a) said etch-stop layer having a composition such that a strained layer results that is substantially transparent to the wavelengths of radiation generated by the laser.

2. In a ridge or selectively-buried ridge waveguide semiconductor laser generating radiation at given wavelengths and having a body comprising a III-V alloy substrate and epitaxially deposited over the substrate an active layer with one or more quantum wells, an optical confinement layer over the active layer, and a cladding layer, and forming a P-N junction between the cladding layer and the substrate and with an etch-stop layer located between the optical confinement layer and the active layer, the improvement comprising:

(a) said etch-stop layer having a composition such that a strained layer results that is substantially transparent to wavelengths of radiation generated by the laser.

3. The semiconductor laser of claim 2, wherein the substrate is GaAs, and the etch-stop layer is $Ga_xIn_{1-x}P$, with $x > 0.5$.

4. The semiconductor laser of claim 3, wherein the optical confinement layer is AlGaInP.

5. The semiconductor laser of claim 4, wherein the active layer is AlGaInP.

6. The semiconductor laser of claim 2, wherein the etch-stop layer is free of Al.

7. The semiconductor laser of claim 2, wherein the substrate is InP, and the etch-stop layer is tensile-strained InGaAsP.

8. The semiconductor laser of claim 2, wherein the substrate is GaAs, and the etch-stop layer is tensile-strained AlGaAsP.

9. The semiconductor laser of claim 2, wherein the substrate is GaAs, the etch-stop layer is tensile-strained GaInP, and further comprising cladding layers of AlGaInP.

10. The semiconductor laser of claim 2, wherein the etch-stop layer has a thickness in the range of 40–100 A.

11. A method of making a ridge or selectively-buried ridge waveguide semiconductor laser generating radiation at given wavelengths, comprising:

(a) providing a substrate,
    (b) epitaxially depositing over the substrate an active layer with one or more quantum wells, an optical confinement layer over the active layer, and a cladding layer, and forming a P-N junction between the cladding layer and the substrate,
    (c) epitaxially depositing an etch-stop layer over the cladding layer,
    (d) epitaxially depositing over the etch-stop layer at least one additional layer,
    (e) selectively etching off portions of the additional layer using an etchant that attacks the additional layer at a substantially faster rate than the etch-stop layer, and
    (f) said etch-stop layer having a composition such that a strained layer results that is substantially transparent to the wavelengths of radiation generated by the laser.

12. The method of claim 11, wherein semiconductor material is regrown over the regions removed by etching.

13. The method of claim 12, wherein the substrate is of GaAs, the active and confinement layers are of AlGaInP, and the etch-stop layer is of $Ga_xIn_{1-x}P$ with $x > 0.5$.

14. The method of claim 11, wherein when the substrate is of InP, the etch-stop layer is InGaAsP, and when the substrate is GaAs, the etch-stop layer is AlGaAsP.

* * * * *